United States Patent
Marin et al.

(10) Patent No.: US 11,791,228 B2
(45) Date of Patent: Oct. 17, 2023

(54) METHOD FOR FORMING EMBEDDED GROUNDING PLANES ON INTERCONNECT LAYERS

(71) Applicant: Intel Corporation, Santa Clara, CA (US)

(72) Inventors: Brandon C. Marin, Chandler, AZ (US); Kristof Darmawikarta, Chandler, AZ (US); Roy Dittler, Chandler, AZ (US); Jeremy Ecton, Gilbert, AZ (US); Darko Grujicic, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1018 days.

(21) Appl. No.: 16/380,486

(22) Filed: Apr. 10, 2019

(65) Prior Publication Data

US 2020/0328131 A1  Oct. 15, 2020

(51) Int. Cl.
*H01L 23/02* (2006.01)
*H01L 23/31* (2006.01)
*H01L 23/488* (2006.01)

(52) U.S. Cl.
CPC ...... *H01L 23/3114* (2013.01); *H01L 23/3128* (2013.01); *H01L 23/488* (2013.01)

(58) Field of Classification Search
CPC ..................... H01L 23/3114; H01L 2224/0233
USPC .......................... 257/698, 773, 786, 659, 758
See application file for complete search history.

(56) References Cited

U.S. PATENT DOCUMENTS

| | | | | |
|---|---|---|---|---|
| 7,473,999 B2 * | 1/2009 | Lin | ...................... | H01L 23/3192 257/773 |
| 7,969,006 B2 * | 6/2011 | Lin | .......................... | H01L 24/11 257/773 |
| 8,030,775 B2 * | 10/2011 | Lin | .................... | H01L 23/53238 257/781 |
| 8,072,073 B2 * | 12/2011 | Kikuchi | .............. | H01L 23/5283 257/774 |
| 8,193,636 B2 * | 6/2012 | Lee | ...................... | H01L 23/3107 257/691 |
| 8,492,808 B2 * | 7/2013 | Omori | ............... | H01L 23/53238 438/653 |
| 10,157,864 B1 * | 12/2018 | Yu | ........................ | H01L 23/3128 |
| 2008/0247704 A1 * | 10/2008 | Kodama | .............. | H05K 1/0274 385/14 |
| 2011/0254165 A1 * | 10/2011 | Muranaka | ......... | H01L 23/53295 257/E23.161 |
| 2016/0056226 A1 * | 2/2016 | Song | .................... | H01L 23/3114 257/528 |
| 2020/0075496 A1 * | 3/2020 | Yu | ........................... | H01L 24/32 |

\* cited by examiner

*Primary Examiner* — Nitin Parekh
(74) *Attorney, Agent, or Firm* — Schwabe, Williamson & Wyatt, P.C.

(57) ABSTRACT

Embodiments disclosed herein include electronic packages with a ground plate embedded in the solder resist that extends over signal traces. In an embodiment, the electronic package comprises a substrate layer, a trace over the substrate layer, and a first pad over the substrate layer. In an embodiment, a solder resist is disposed over the trace and the first pad. In an embodiment a trench is formed into the solder resist, and the trench extends over the trace. In an embodiment, a conductive plate is disposed in the trench, and is electrically coupled to the first pad by a via that extends from a bottom surface of the trench through the solder resist.

17 Claims, 10 Drawing Sheets

METHOD FOR FORMING EMBEDDED GROUNDING PLANES ON INTERCONNECT LAYERS

TECHNICAL FIELD

Embodiments of the present disclosure relate to electronic packaging, and more particularly, to electronic packages with embedded ground plates in the solder resist that extend over signal lines.

BACKGROUND

Signal noise in high-density routing is attenuated by alternating ground and routing layers in the package substrate. The ground layers shield the signal in the routing layers, and reduce any cross-talk between layers or passive components. However, as demands towards smaller form factors increase, the ability to add additional ground layers is no longer an attractive option. The increased layer count increases the Z-height and also increases the cost of the electronic package.

EMBODIMENTS OF THE PRESENT DISCLOSURE

Described herein are electronic packages with embedded ground plates in the solder resist that extend over signal lines and methods of forming such electronic packages, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, improving signal integrity is a critical design consideration in high-density routing architectures. Existing solutions require additional layers to form alternating signal and ground layers. This increases the Z-height of the electronic package and increases costs. Accordingly, embodiments disclosed herein include a packaging architecture that allows for a ground plate to be embedded in the solder resist layer. Replacing a dedicated layer for ground lines with a ground plate embedded in the solder resist layer reduces layer count. Furthermore, since the solder resist is already included in the electronic package, there is no increase in the Z-height. Accordingly, embodiments enable shielding of signal traces at the surface of the electronic package without increased Z-heights and with minimal increases in cost.

Figure 1A:
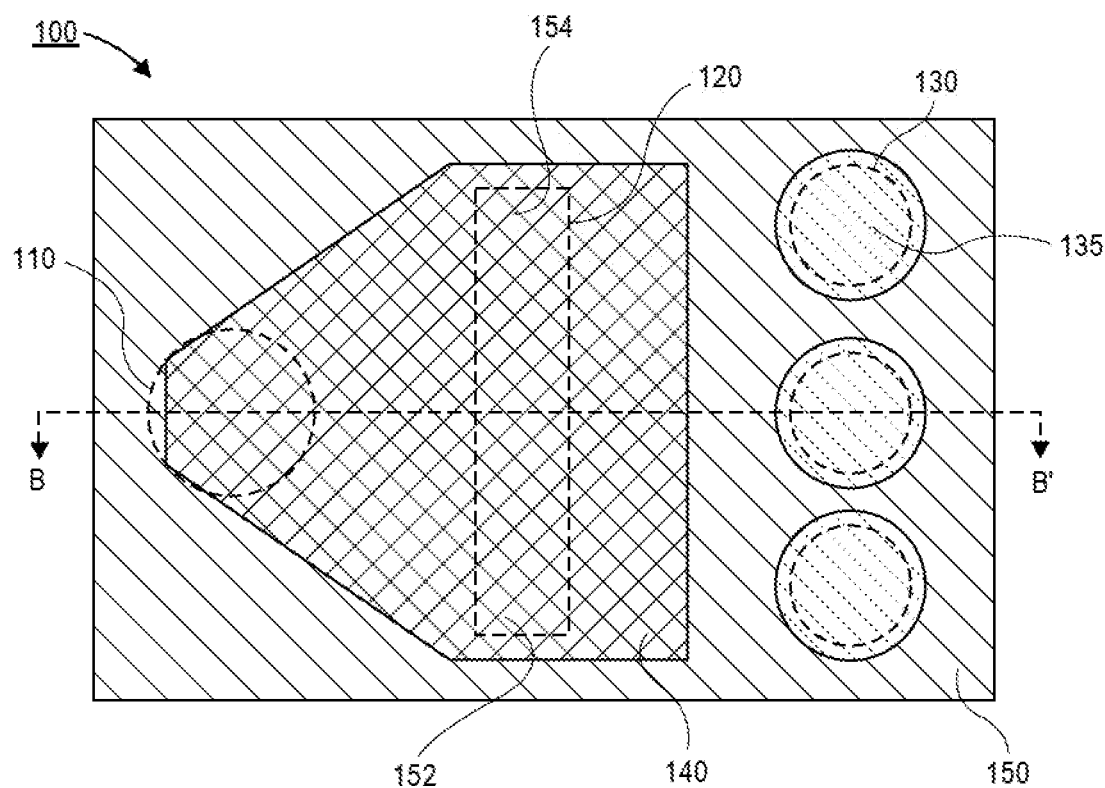
FIG. 1A is a plan view illustration of an electronic package with a ground plate embedded in the solder resist that extends over a signal trace, in accordance with an embodiment.
Figure 1B:
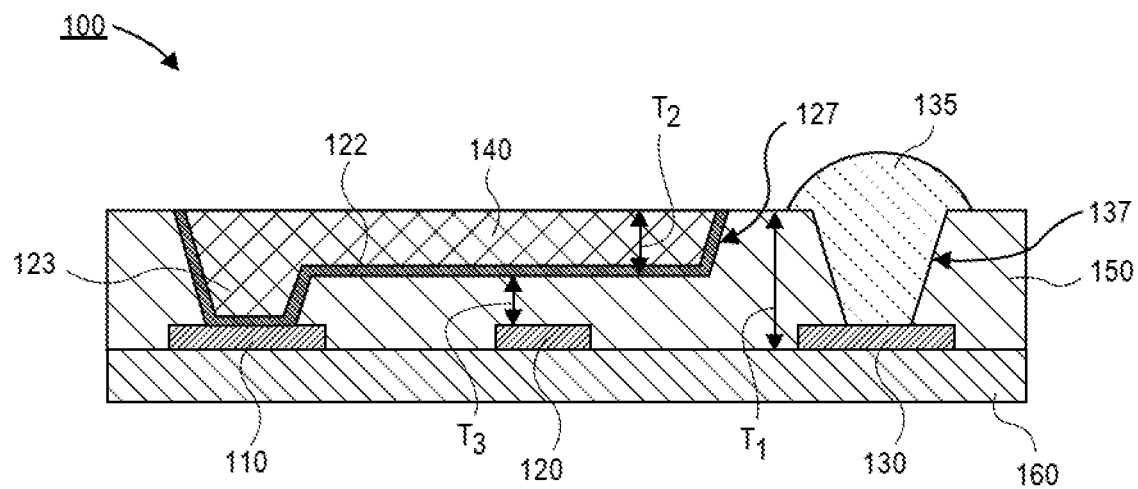
FIG. 1B is a cross-sectional illustration of the electronic package in FIG. 1A, in accordance with an embodiment.

Referring now to FIGS. 1A and 1B, a plan view illustration of a portion of an electronic package 100 and a cross-sectional illustration along line B-B' of FIG. 1A are shown, respectively, in accordance with an embodiment. As shown, the electronic package 100 may comprise a substrate 160. The substrate 160 may be any suitable substrate layer typical of electronic packages, boards, or the like. For example, substrate 160 may be a build-up film or the like. Substrate 160 may be a surface layer of an electronic package (i.e., one or more layers including conductive vias, pads, traces, and the like may be positioned below substrate 160). In some embodiments, the electronic package 100 is a package substrate onto which a die or other components are attached. In other embodiments, the electronic package 100 is a board (e.g., a printed circuit board (PCB) or the like.

In an embodiment, a plurality of conductive features may be formed over the substrate 160. For example, a first pad 110, a second pad 130, and a trace 120 may be formed over the substrate 160. The conductive features (i.e., first pad 110, second pad 130, and trace 120) may be any suitable conductive material, such as copper. In an embodiment, a solder resist 150 is positioned over the substrate 160 and the first pad 110, the second pad 130, and the trace 120.

As shown in FIG. 1A, the first pad 110, the second pad 130, and the trace 120 are shown with dashed lines to indicate that they are positioned below the solder resist 150 or other features. In an embodiment, the solder resist 150 may have a first thickness $T_1$ typical of solder resist in electronic packaging architectures. For example, the first thickness $T_1$ may be between 5 μm and 150 μm.

In an embodiment, the first pad 110 may be a ground pad. In an embodiment, the second pad 130 may be a pad that supports an interconnect 135, such as a solder bump. In some instances, the second pad 130 may be referred to as a solder resist open (SRO) pad since a SRO 137 exposes the pad 130. In an embodiment, the trace 120 may be a signal trace. That is, signals to or from components (not shown) may be propagated along the trace 120.

In an embodiment, the electronic package 100 may comprise a conductive plate 140 that is embedded in the solder resist 150. Particularly, the conductive plate 140 may sit in a trench 127 that is formed into the surface of the solder resist 150. As used herein, "embedded" may refer to being covered along at least sidewall surfaces. For example, the sidewalls of the conductive plate 140 are covered by the solder resist 150. In an embodiment, the trench 127 (and, as a result, the sidewalls of the conductive plate 140) may have tapered profiles. The tapered sidewalls may be characteristic features of the processing (e.g., laser ablation) used to form the trench 127 in the solder resist 150.

In an embodiment, the conductive plate 140 may have a second thickness $T_2$ that is less than the first thickness $T_1$ of the solder resist 150. For example, the second thickness $T_2$ may be between approximately 0.5 μm and 15 μm. A conductive plate 140 with a second thickness $T_2$ that is less than the first thickness $T_1$ allows for the conductive plate 140 to sit entirely in the solder resist 150, and therefore, does not increase the Z-height of the electronic package 100.

The conductive plate 140 may be electrically coupled to the first pad 110 by a via 123. The via 123 may extend from a bottom surface of the trench 127 to the first pad 110. As shown in FIG. 1B, the conductive plate 140 and the via 123 may be lined with a seed layer 122. However, in some embodiments, the seed layer 122 may be indistinguishable from the conductive plate 140 and the via 123 due to diffusion. Since the conductive plate 140 is electrically coupled to the first pad 110, the conductive plate 140 will maintain substantially the same voltage as the first pad 110. Accordingly, when the first pad 110 is a ground pad, the conductive plate 140 will be a ground plate.

In an embodiment, the conductive plate 140 may extend over the trace 120. Extending the conductive plate 140 over the trace 120 allows for the trace 120 to be shielded from cross-talk or other interference and provides improved signal integrity. A bottom surface of the conductive plate 140 may be separated from a top surface of the trace 120 by a portion of the solder resist 150. For example, the solder resist between the top surface of the trace 120 and the bottom surface of the conductive plate 140 may have a third thickness $T_3$. The third thickness $T_3$ may be sufficient to prevent electrical breakdown between the conductive features. For example, the third thickness $T_3$ may be between 2 μm and 145 μm.

In an embodiment, the conductive plate 140 may entirely cover the trace 120. For example, a portion of the trace 120 between a first end 154 and a second end 152 may be covered by the conductive plate 140. In the illustrated embodiment, the first end 154 and the second end 152 of the trace 120 are shown as being terminal ends of the trace 120. However, it is to be appreciated that the first end 154 and the second end 152 may not be the terminal ends of the trace 120 in some embodiments. In such embodiments, the conductive plate 140 may not cover the entire length of the trace 120.

In an embodiment, the first pad 110 may be laterally adjacent to the trace 120. That is, the first pad 110 may be positioned to a side of the trace 120 and between the first end 154 and the second end 152 of the trace 120. In other embodiments, the first pad 110 may be located at any location on the substrate 160 (e.g., aligned with the trace 120 so that a centerline of the pad 110 is coincident with a longitudinal centerline of the trace 120).

In the illustrated embodiment, a single first pad 110 is electrically coupled to the conductive plate 140. However, it is to be appreciated that the conductive plate 140 may be electrically coupled to any number of pads (e.g., ground pads). Additionally, while the conductive plate 140 is illustrated as extending over a single trace 120, it is to be appreciated that the conductive plate 140 may extend over any number of traces 120.

Figure 2A:
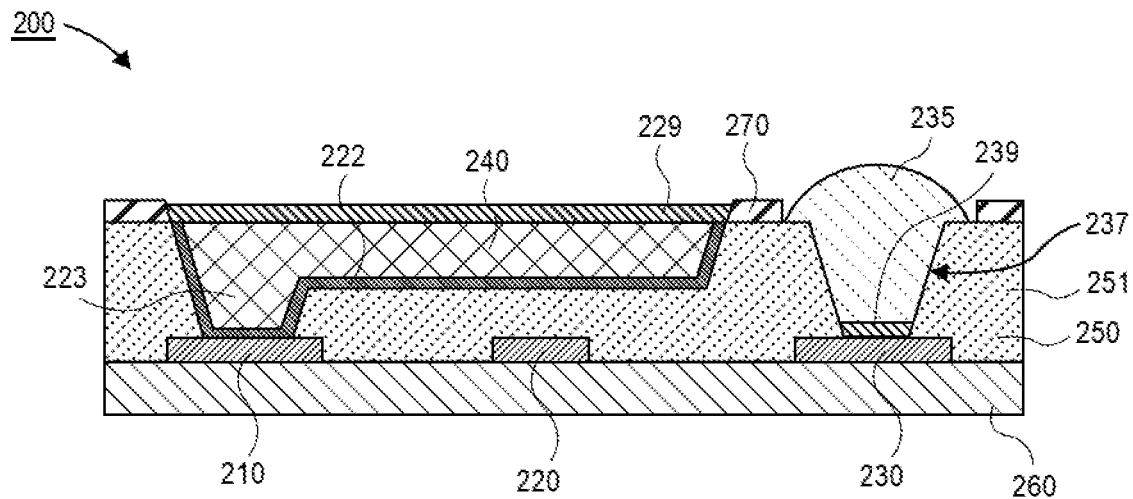
FIG. 2A is a cross-sectional illustration of an electronic package with a ground plate over the signal trace with a surface finish layer, in accordance with an embodiment.

Referring now to FIG. 2A, a cross-sectional illustration of an electronic package 200 is shown, in accordance with an additional embodiment. In an embodiment, the electronic package 200 in FIG. 2A is substantially similar to the electronic package 100 in FIG. 1B, with the exception that a surface finish layer 229 is disposed over the conductive plate 240 and a surface finish layer 239 is disposed over the second pad 230.

For example, the electronic package 200 may comprise a substrate 260 with conductive features (i.e., first pad 210, second pad 230, and trace 220) over the substrate 260. A solder resist 250 with trench 227 and SRO 237 may be formed over the substrate 260. A conductive plate 240 may be electrically coupled to the first pad 210 by a via 223. In some embodiments, a seed layer 222 may be formed between the conductive plate 240 and the solder resist 250. An interconnect 235 may fill the SRO 237.

In an embodiment, the surface finish layer 239 may improve the bonding between the interconnect 235 and the second pad 230. However, the processing used to form the surface finish layer 239 may be autocatalytic, and as such, the surface finish layer 229 may simultaneously deposit on a surface of the conductive plate 240. Such a surface finish layer 229 on the conductive plate 240 does not negatively impact performance of the electronic package 200 since signals are not transmitted along the conductive plate 240, and any conductivity issues associated with the surface finish layer 229 on the conductive plate 240 may be ignored. In an embodiment, a mask layer 270 may be positioned over the solder resist 250. The mask layer 270 may comprise a material that is resistive to the formation of a seed layer. For example, the mask layer 270 may comprise $TiO_2$.

Figure 2B:
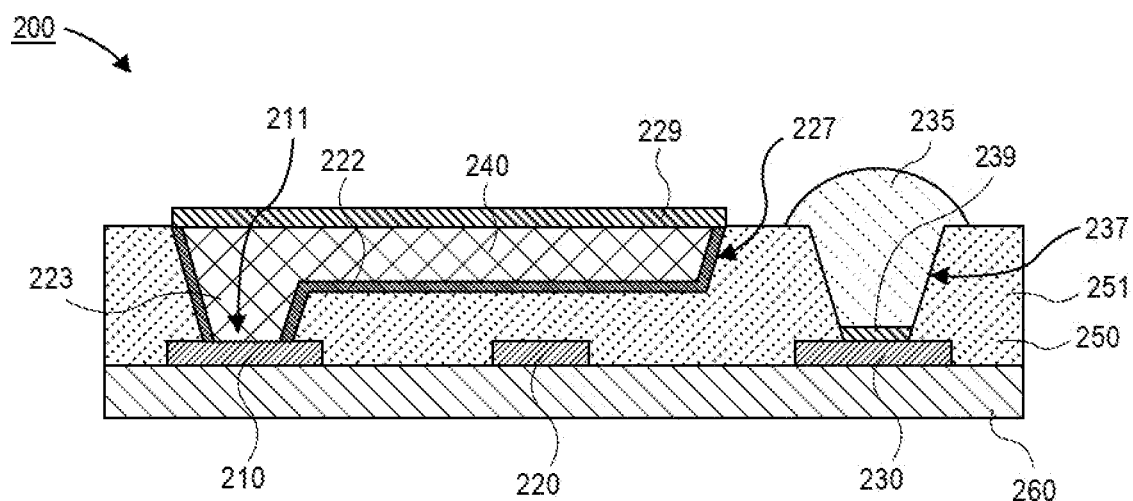
FIG. 2B is a cross-sectional illustration of an electronic package with a solder resist layer that comprises activator particles, in accordance with an embodiment.

Referring now to FIG. 2B, a cross-sectional illustration of an electronic package 200 is shown, in accordance with an additional embodiment. In an embodiment, the electronic package 200 in FIG. 2B may be substantially similar to the electronic package 100 in FIG. 1B, with the exception that the solder resist 250 is modified. Particularly, the solder resist 250 may comprise particles 251 that allow for simultaneous formation of the seed layer 222 and the trench 227. For example, the particles 251 may comprise palladium, gold, silver, ruthenium, cobalt, copper, nickel, titanium, aluminum, lead, silicon, or tantalum. During laser ablation of the solder resist 250 to form the trench 227, the particles 251 may be activated and form the seed layer 222.

In contrast to the embodiments disclosed above, a seed layer may not be disposed over the surface 211 of the first pad 210. This is because seed layer 222 formation is the result of laser ablation of the solder resist 250. Accordingly, since surface 211 is not a solder resist material, there will not be a seed layer 222. The particles 251 may remain detectable in the solder resist 250 in the final device. For example, energy-dispersive X-ray spectroscopy (EDS) or X-ray photoelectron spectroscopy (XPS) may be used to detect the presence and oxidation state of the particles 251 distributed in the solder resist 250.

Referring now to FIGS. 3A-3I a series of cross-sectional illustrations depicting a process for forming an electronic package 300 is shown, in accordance with an embodiment.

Figure 3A:
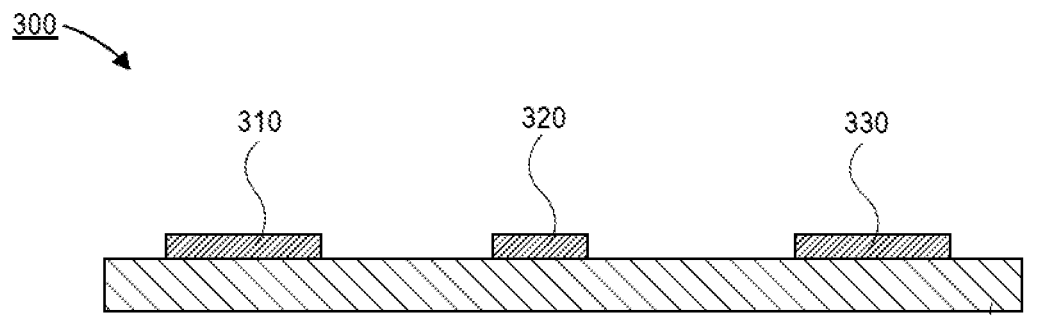
FIG. 3A is a cross-sectional illustration of an electronic package with a first pad, a signal trace, and a second pad over a substrate, in accordance with an embodiment.

Referring now to FIG. 3A, a cross-sectional illustration of an electronic package 300 is shown. Particularly, a substrate 360 of the electronic package 300 is illustrated. In an embodiment, the substrate 360 may be a surface layer of a package substrate. For example, one or more layers (e.g., build-up film layers, etc.) with conductive features (e.g., traces, pads, vias, etc.) may be positioned below the substrate 360. In an embodiment, the substrate 360 is part of an electronic package 300 onto which one or more dies or other components are attached. In other embodiments, substrate 360 is part of an electronic package 300 that is a board (e.g., a PCB).

In an embodiment, a plurality of conductive features may be positioned over the substrate 360. For example, a first pad 310, a second pad 330, and a trace 320 are shown in FIG. 3A. The first pad 310, the second pad 330, and the trace 320 may comprise any conductive material (e.g., copper). In an embodiment, the first pad 310 may be a ground pad, the second pad 330 may be an SRO pad, and the trace 320 may be for propagating signals.

Figure 3B:
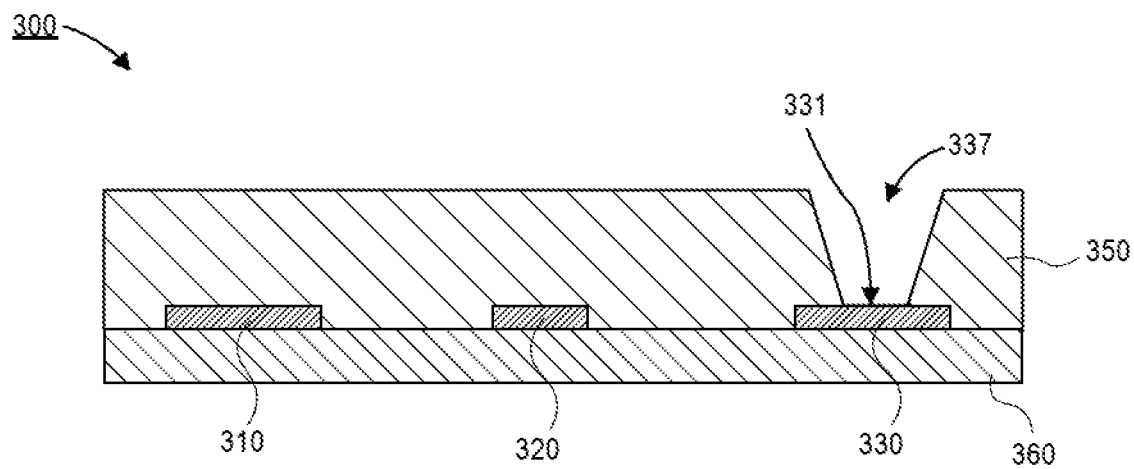
FIG. 3B is a cross-sectional illustration after a solder resist is disposed over the first pad, the signal trace, and the second pad and a solder resist open (SRO) is formed through the solder resist to expose the second pad, in accordance with an embodiment.

Referring now to FIG. 3B, a cross-sectional illustration of the electronic package 300 after a solder resist 350 is disposed over the substrate 360, the first pad 310, the second pad 330, and the trace 320 is shown, in accordance with an embodiment. In an embodiment, the solder resist 350 may be disposed onto the surface with a lamination process or the like. The solder resist 350 may have a typical thickness for solder resists in the packaging arts. For example, a thickness of the solder resist 350 may be between approximately 5 μm and 150 μm. In an embodiment, an SRO 337 may be patterned in the solder resist 350. The SRO 337 may expose a portion of a surface 331 of the second pad 330. In an embodiment, the SRO 337 may be formed with a lithographic process or the like.

Figure 3C:
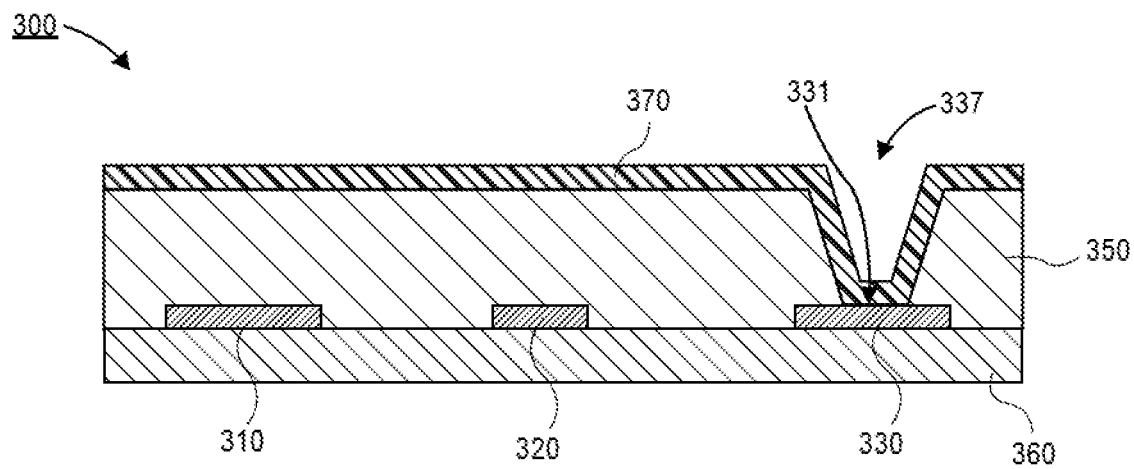
FIG. 3C is a cross-sectional illustration after a mask layer is disposed over the solder resist, in accordance with an embodiment.

Referring now to FIG. 3C, a cross-sectional illustration of the electronic package 300 after a mask layer 370 is disposed over exposed surface is shown, in accordance with an embodiment. In an embodiment, the mask layer 370 may comprise titanium. The mask layer 370 may be deposited with any suitable deposition process. For example, the mask layer 370 may be deposited with a sputtering process or the like. In an embodiment a thickness of the mask layer 370 may be between approximately 25 nm and 50 nm. In an embodiment, the mask layer 370 is blanket deposited over the exposed surfaces. That is, the mask layer 370 may cover exposed surfaces of the solder resist 350, the sidewalls of the SRO 337, and the exposed surface 331 of the second pad 330.

Figure 3D:
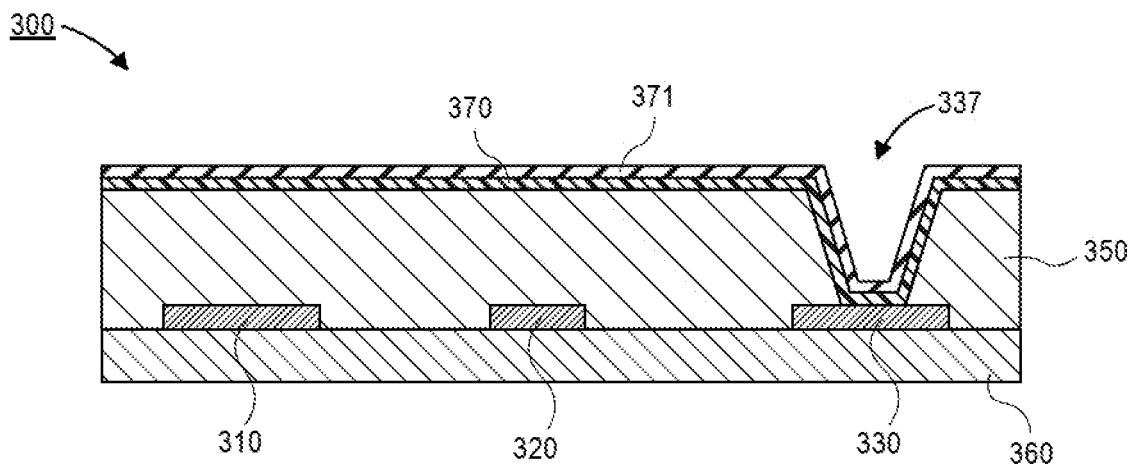
FIG. 3D is a cross-sectional illustration after the mask layer is modified, in accordance with an embodiment.

Referring now to FIG. 3D, a cross-sectional illustration of the electronic package 300 after the mask layer 370 is modified is shown, in accordance with an embodiment. In some embodiments, the mask layer 370 may be modified by oxidizing. For example, when the mask layer 370 is titanium, a modified mask layer 371 of the mask layer 370 may comprise titanium oxide ($TiO_2$). Titanium oxide may be particularly beneficial as a mask layer since it resists formation of a seed layer, and will therefore, not plate with an electroless process. Titanium oxide resists formation of a seed layer because van der Waals interaction between titanium oxide and ions in the seeding solution are weak. In an embodiment, the oxidation of the mask layer 370 may be implemented in an oven. For example, titanium may sufficiently oxidize to form titanium oxide with an approximately 90 minute hold at approximately 200° C. under atmospheric composition. While the mask layer 370 and modified mask layer 371 are described herein as titanium and titanium oxide, respectively, it is to be appreciated that any suitable material system may be used that is resistant to the formation of a seed layer. In some embodiments (as will be described in greater detail below) the mask layer 370 may not need further modification to prevent formation of a seed layer.

Figure 3E:
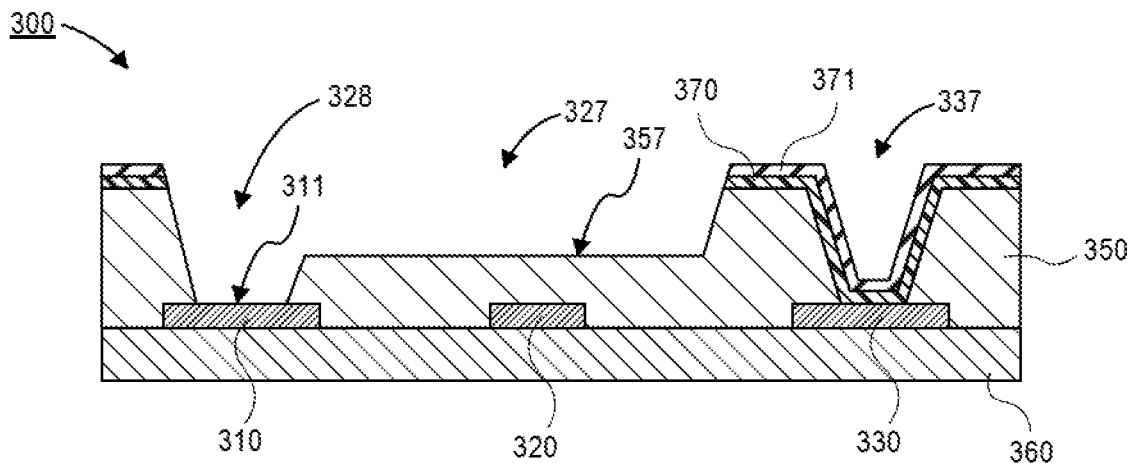
FIG. 3E is a cross-sectional illustration after a trench and a via opening are formed into the solder resist, in accordance with an embodiment.

Referring now to FIG. 3E, a cross-sectional illustration of the electronic package 300 after a trench 327 and a via opening 328 are patterned into the solder resist 350 is shown, in accordance with an embodiment. In an embodiment, the trench 327 and the via opening 328 may be patterned with a laser ablation process. In such embodiments, sidewall surfaces of the trench 327 and the via opening 328 may be tapered, as is characteristic of laser ablating processes. The laser ablation process may also remove portions of the mask layer 370 and the modified mask layer 371 from over the solder resist 350. Accordingly, the surfaces 357 of the trench 327 and the via opening 328 are free from the mask layers 370, 371. In an embodiment, residual portions of the mask layer 370, 371, may be removed with a cleaning process, such as a desmear process.

In an embodiment, the trench 327 may extend over the trace 320. However, the depth of the trench 327 leaves a portion of the solder resist 350 that separates a top surface of the trace 320 from the surface 357 of the trench 327. In an embodiment, the via opening 328 extends down from the surface 357 of the trench through the remainder of the solder resist 350 to expose a portion of a surface 311 of the first pad 310. That is, the via opening 338 may be within a footprint of the trench 327.

Figure 3F:
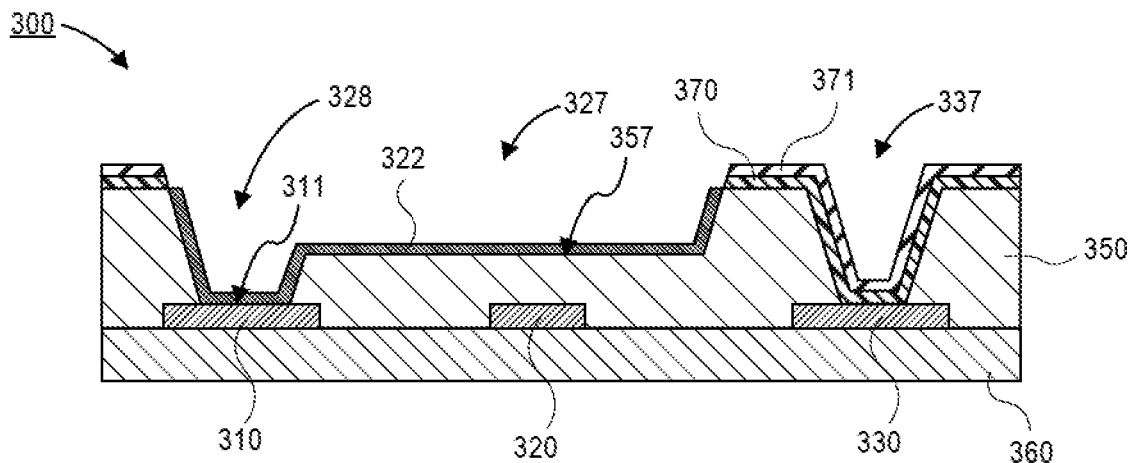
FIG. 3F is a cross-sectional illustration after a seed layer is selectively disposed over surfaces of the trench, in accordance with an embodiment.

Referring now to FIG. 3F, a cross-sectional illustration of the electronic package 300 after a seed layer 322 is disposed in the trench 327 and the via opening 328 is shown, in accordance with an embodiment. In an embodiment, the seed layer 322 may be deposited with a standard electroless seed layer activation process. For example, a palladium seed layer may be deposited. As noted above, the modified mask layer 371 prevents the seed layer 322 from adsorbing to the surface. Accordingly, the seed layer 322 is selectively adsorbed over the surfaces 357 of the trench 327 and the via opening 328. In an embodiment, the seed layer 322 may also adsorb to the surface 311 of the first pad 310.

Figure 3G:
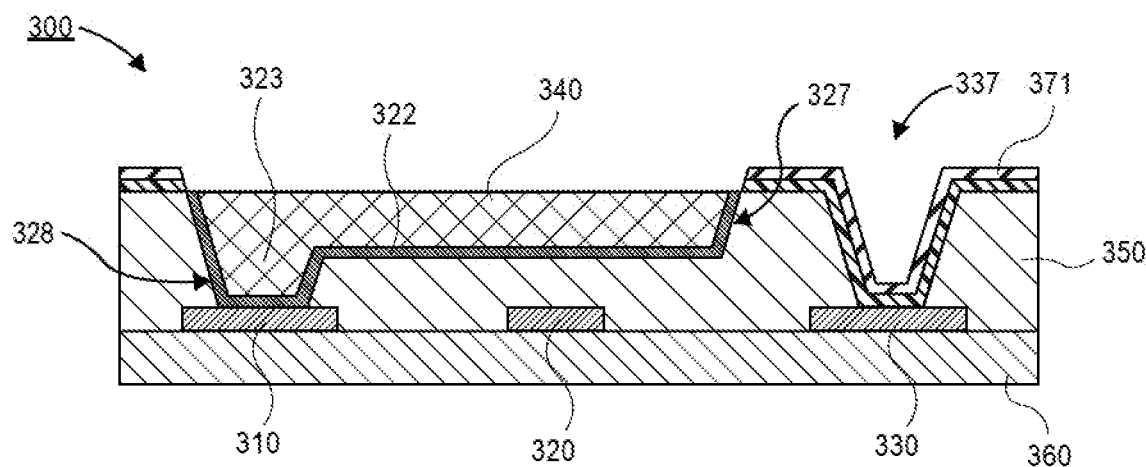
FIG. 3G is a cross-sectional illustration after a via is disposed in the via opening and a conductive plate is disposed in the trench, in accordance with an embodiment.

Referring now to FIG. 3G, a cross-sectional illustration of the electronic package 300 after a via 323 and a conductive plate 340 are disposed in the via opening 328 and the trench 327 is shown, in accordance with an embodiment. In an embodiment, the via 323 fills the via opening 328 and the conductive plate 340 fills the trench 327. In an embodiment, the conductive plate 340 may be referred to as being embedded in the solder resist 350. That is, at least sidewall surfaces of the conductive plate 340 may be covered by the solder resist 350.

Formation of the conductive plate 340 and via 323 provide a conductive feature over the trace 320. When the first pad 310 is a ground pad, the trace is now shielded and signal integrity is improved. In contrast to currently available shielding architectures, the use of a conductive plate 340 in the solder resist 350 does not increase the Z-height of the device. Furthermore, an additional layer (e.g., another build-up layer) is not needed and costs are reduced.

In an embodiment, the via 323 and the conductive plate 340 may be deposited with a plating process. For example, the plating process may be an electroless plating process. In embodiments where the mask layer 370 is a conductive material (e.g., titanium) a continuous conductive layer is provided, and the plating process may also be an electrolytic plating process. Such embodiments may increase the speed of deposition compared to an electroless plating process. In an embodiment, the conductive plate 340 and the via 323 may comprise copper or any other suitable conductor.

Figure 3H:
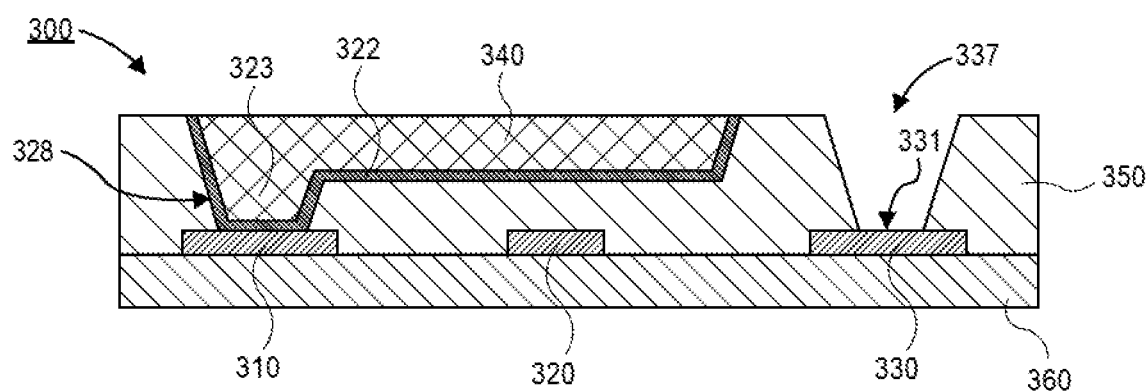
FIG. 3H is a cross-sectional illustration after the mask is stripped, in accordance with an embodiment.

Referring now to FIG. 3H, a cross-sectional illustration of the electronic package 300 after the mask layer 370, 371 is removed is shown, in accordance with an embodiment. The mask layers 370, 371 may be removed with an etching process that utilizes an etching chemistry that is selective to the mask layers 370, 371. For example, in the case of a titanium mask layer 370 and a titanium oxide modified mask layer 371, an etching chemistry comprising potassium hydroxide (KOH) and peroxide may be used. Removal of the mask layers 370, 371 exposes the surface 331 of the second pad 330.

Figure 3I:
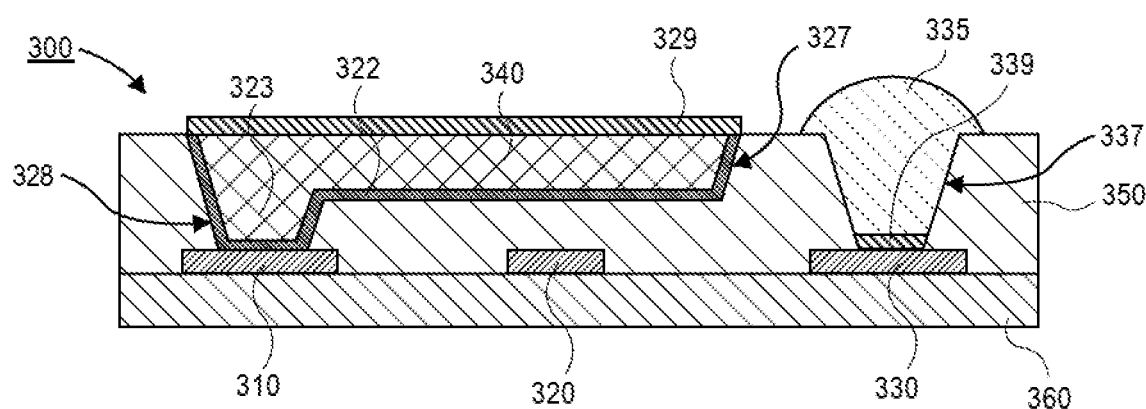
FIG. 3I is a cross-sectional illustration after a surface finish is applied to the conductive plate and the second pad, and a solder ball is disposed in the SRO, in accordance with an embodiment.

Referring now to FIG. 3I, a cross-sectional illustration of the electronic package 300 after a surface finish 329, 339 is applied and an interconnect 335 is disposed in the SRO 337 is shown, in accordance with an embodiment. In an embodiment, the surface finish 329, 339 may be any suitable surface finish. For example, the surface finish 329, 339 may comprise an electroless nickel-electroless palladium-immersion gold (ENEPIG) surface finish, or the like. Since the process is autocatalytic, the surface finish 329 may plate on the conductive plate 340 in addition to plating on the second pad 330. However, it is to be appreciated that surface finish layer 329 on the conductive plate 340 does not negatively impact performance of the electronic package 300 since signals are not transmitted along the conductive plate 340, and any conductivity issues associated with the surface finish layer 329 on the conductive plate 340 may be ignored.

Referring now to FIGS. 4A-4D, a series of cross-sectional illustrations depicting a process for forming an electronic package are shown, in accordance with an embodiment. The process in FIG. 4A-4D utilize a mask layer that does not need further modification after deposition in order to prevent adsorption of the seed layer.

Figure 4A:
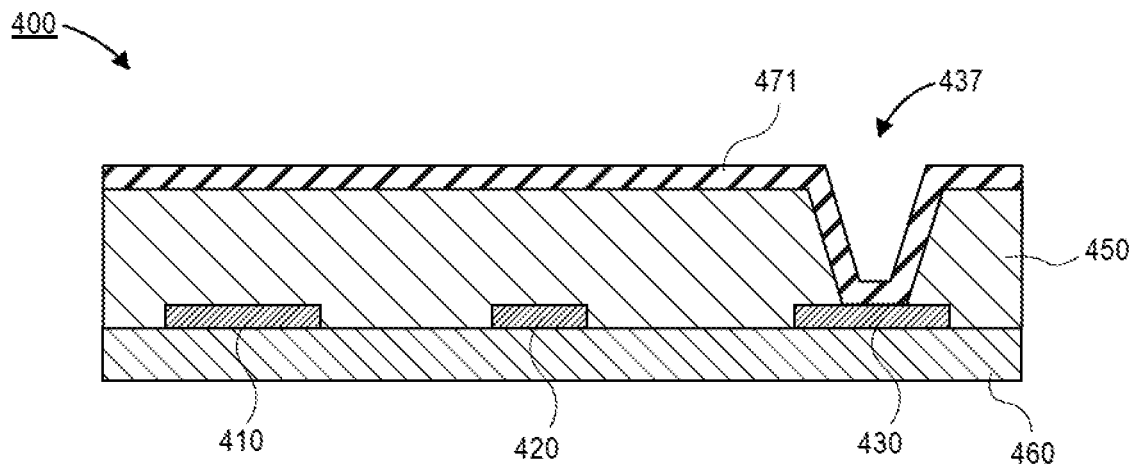
FIG. 4A is a cross-sectional illustration of an electronic package after a mask layer is disposed over a solder resist and into an SRO, in accordance with an embodiment.

Referring now to FIG. 4A, a cross-sectional illustration of an electronic package 400 is shown, in accordance with an embodiment. In an embodiment, the electronic package 400 may be substantially similar to the electronic package 300 shown in FIG. 3C, with the exception that the mask layer 471 does not need further modification in order to prevent adsorption of the seed layer. In an embodiment, the electronic package 400 comprises a substrate 460, a first pad 410, a second pad 430, a trace 420, a solder resist 450, and a SRO 437. In an embodiment, the mask layer 471 may be disposed with a sputtering process. The use of a radio-frequency (RF) sputtering process allows for a material, such as titanium oxide, to be directly deposited. Accordingly, the additional processing operations of oxidation may be omitted.

Figure 4B:
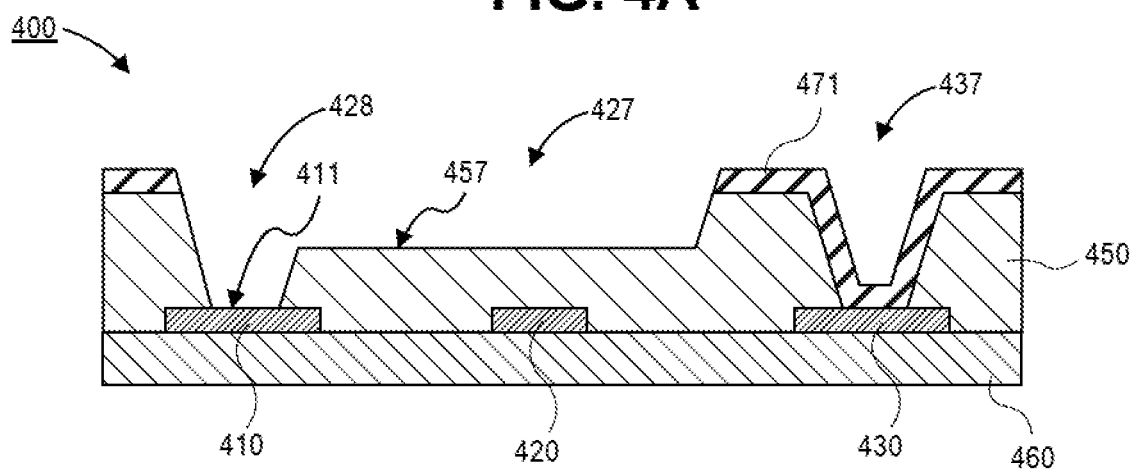
FIG. 4B is a cross-sectional illustration after a via opening and a trench are formed in the solder resist, in accordance with an embodiment.

Referring now to FIG. 4B, a cross-sectional illustration of the electronic package 400 after a trench 427 and a via opening 428 are patterned into the solder resist 450 is shown, in accordance with an embodiment. In an embodiment, the trench 427 and the via opening 428 may be patterned with a laser ablation process. In such embodiments, sidewall surfaces of the trench 427 and the via opening 428 may be tapered, as is characteristic of laser ablating processes. The laser ablation process may also remove portions of the mask layer 471 from over the solder resist 450. Accordingly, the surfaces 457 of the trench 427 and the via opening 428 are free from the mask layer 471. In an embodiment, residual portions of the mask layer 471 may be removed with a cleaning process, such as a desmear process.

In an embodiment, the trench 427 may extend over the trace 420. However, the depth of the trench 427 leaves a portion of the solder resist 450 that separates a top surface of the trace 420 from the surface 457 of the trench 427. In an embodiment, the via opening 428 extends down from the surface 457 of the trench through the remainder of the solder resist 450 to expose a portion of a surface 411 of the first pad 410.

Figure 4C:
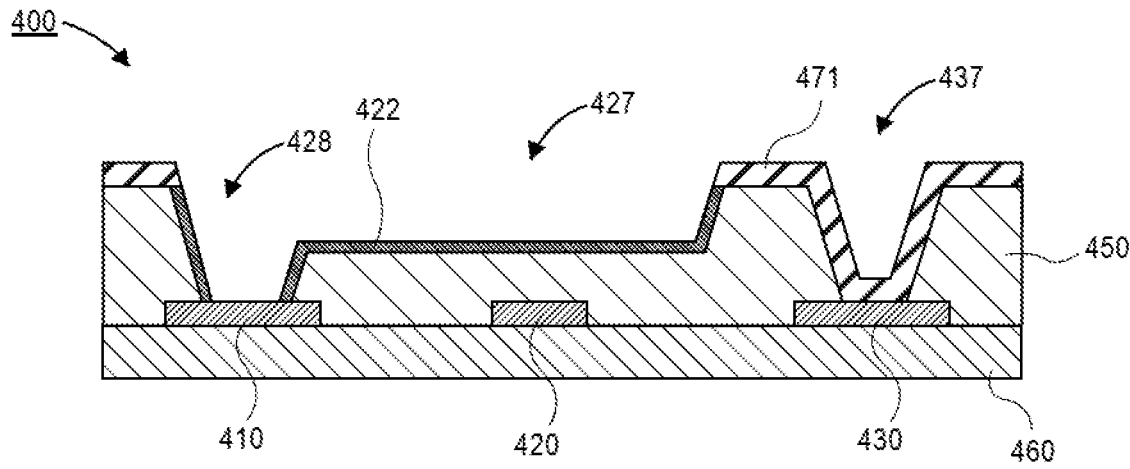
FIG. 4C is a cross-sectional illustration after a seed layer is selectively disposed in the trench, in accordance with an embodiment.

Referring now to FIG. 4C, a cross-sectional illustration of the electronic package 400 after a seed layer 422 is disposed in the trench 427 and the via opening 428 is shown, in accordance with an embodiment. In an embodiment, the seed layer 422 may be deposited with a standard electroless seed layer activation process. For example, a palladium seed layer may be deposited. As noted above, the mask layer 471 prevents the seed layer 422 from adsorbing to the surface. Accordingly, the seed layer 422 is selectively adsorbed over the surfaces 457 of the trench 427 and the via opening 428. In an embodiment, the seed layer 422 may also adsorb to the surface 411 of the first pad 410.

Figure 4D:
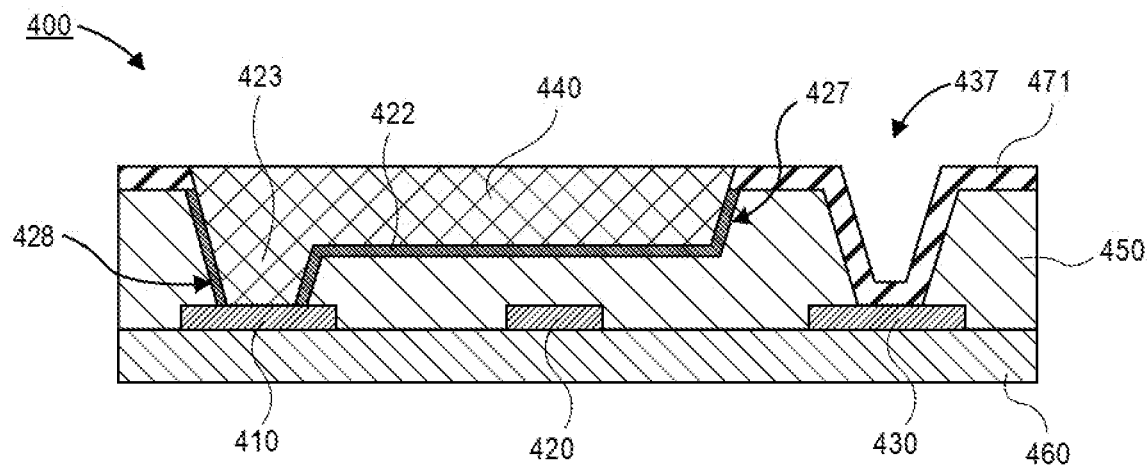
FIG. 4D is a cross-sectional illustration after a via is disposed in the via opening and a conductive plate is disposed in the trench, in accordance with an embodiment.

Referring now to FIG. 4D, a cross-sectional illustration of the electronic package 400 after a via 423 and a conductive plate 440 are disposed in the via opening 428 and the trench 427 is shown, in accordance with an embodiment. In an embodiment, the via 423 fills the via opening 428 and the conductive plate 440 fills the trench 427. In an embodiment, the conductive plate 440 may be referred to as being embedded in the solder resist 450. That is, at least sidewall surfaces of the conductive plate 440 may be covered by the solder resist 450.

Formation of the conductive plate 440 and via 423 provide a conductive feature over the trace 420. When the first pad 410 is a ground pad, the trace is now shielded and signal integrity is improved. In contrast to currently available shielding architectures, the use of a conductive plate 440 in the solder resist 450 does not increase the Z-height of the device. Furthermore, an additional layer (e.g., another build-up layer) is not needed and costs are reduced.

In an embodiment, the via 423 and the conductive plate 440 may be deposited with a plating process. For example, the plating process may be an electroless plating process. While processing operations are saved by directly depositing titanium oxide as the mask 471, it is to be appreciated that there is no longer a continuous conductive film (as is the case in FIG. 3G), and electrolytic plating is not practical. In an embodiment, the conductive plate 440 and the via 423 may comprise copper or any other suitable conductor.

Following the formation of the conductive plate 440, processing operations may continue with processes substantially similar to those disclosed with respect to FIGS. 3H and 3I in order to finish fabrication of the electronic package 400.

Referring now to FIGS. 5A-5D a series of cross-sectional illustrations depict a process for forming an electronic package in accordance with an additional embodiment. In an embodiment, the process described in FIGS. 5A-5D differ from those above in that the solder resist comprises activator particles. The activator particles allow for simultaneous formation of the seed layer with the formation of the trench and the via opening.

Figure 5A:
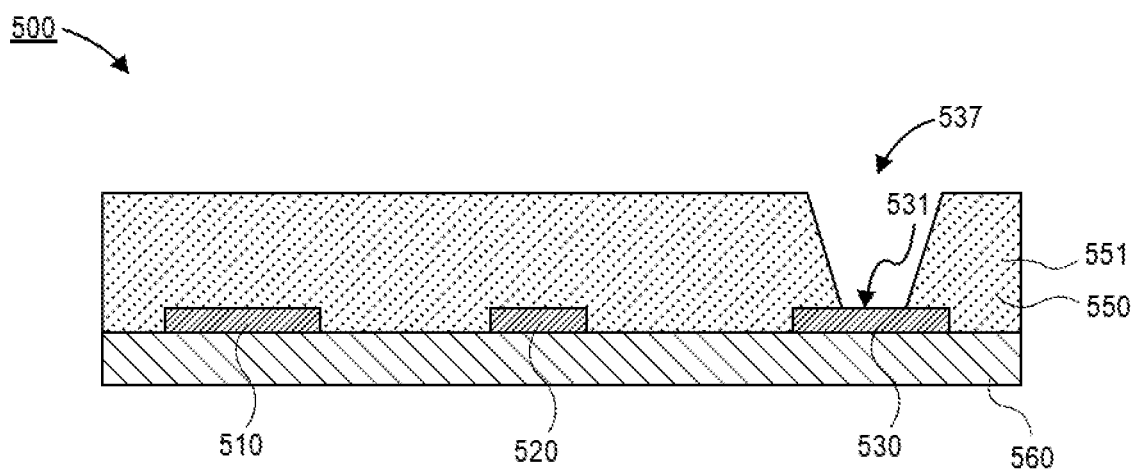
FIG. 5A is a cross-sectional illustration of an electronic package with a solder resist that comprises activator particles and an SRO through the solder resist with a seed layer formed on sidewalls of the SRO, in accordance with an embodiment.

Referring now to FIG. 5A, a cross-sectional illustration of an electronic package 500 is shown, in accordance with an embodiment. In an embodiment, the electronic package 500 comprises a substrate 560, a first pad 510, a second pad 530, a trace 520, and a solder resist 550. In an embodiment, the solder resist 550 comprises activator particles 551. The activator particles 551 may comprise palladium or any other suitable activator particle that is capable of forming a seed layer. In an embodiment, laser ablation of the solder resist 550 may result in the activation of the activator particles 551 and formation of the seed layer. Furthermore, when fluence is not as high as the fluence provided by a laser, there will be no activation. For example, exposing the surface 531 of second pad 530 during lithographic patterning of the SRO 537 will not result in the formation of a seed layer along the sidewall surfaces of the SRO 537. In an embodiment, the activator particles 551 may remain detectable in the solder resist 550 in the final device. For example, EDS or XPS may be used to detect the presence of the activator particles 551 distributed in the solder resist 550.

Figure 5B:
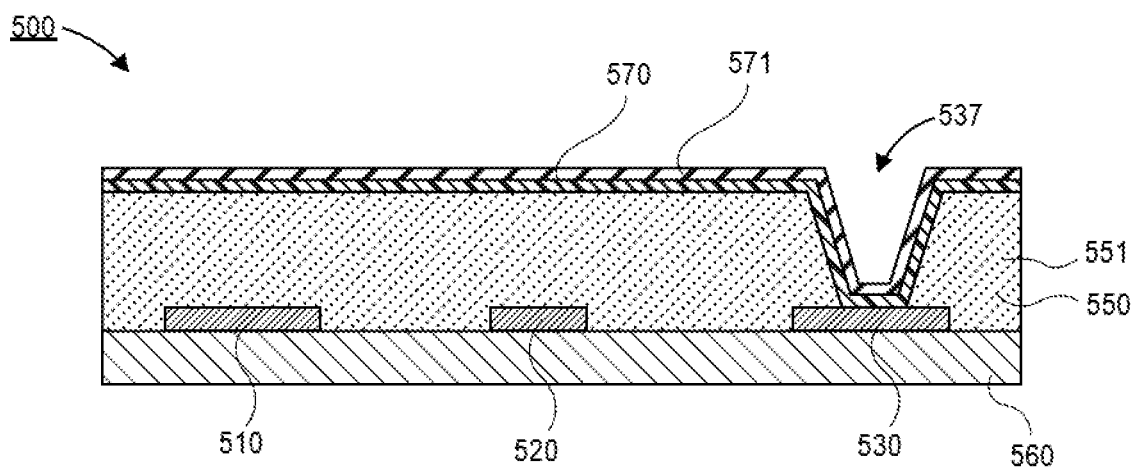
FIG. 5B is a cross-sectional illustration after a mask layer is disposed and modified, in accordance with an embodiment.

Referring now to FIG. 5B, a cross-sectional illustration of the electronic package 500 after a mask layer 570, 571 is disposed over exposed surfaces is shown, in accordance with an embodiment. In an embodiment, the mask layer 570, 571 may comprise a mask layer 570 and a modified mask layer 571. For example, the mask layer 570 may comprise titanium, and the modified mask layer 571 may comprise titanium oxide. In other embodiments, a layer of only titanium oxide may be used (e.g., similar to the process flow described in FIGS. 4A-4D).

Figure 5C:
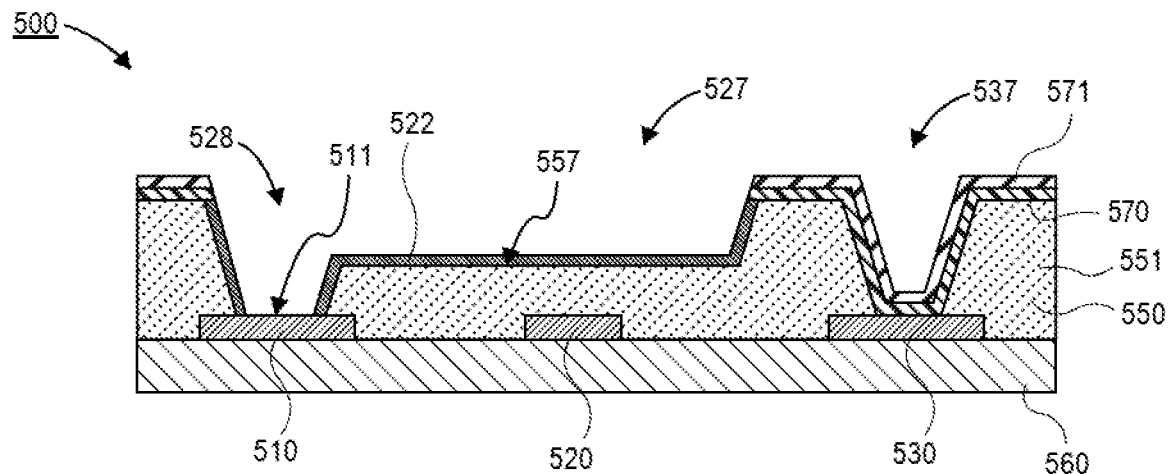
FIG. 5C is a cross-sectional illustration after a via opening and a trench with a seed layer along surfaces of the via opening and trench is formed in the solder resist, in accordance with an embodiment.

Referring now to FIG. 5C, a cross-sectional illustration of the electronic package 500 after a trench 527 and a via opening 528 are patterned is shown, in accordance with an embodiment. In an embodiment, the trench 527 and the via opening 528 may be patterned with a laser ablation process. The use of laser ablation results in the activator particles 551 being activated and forming a seed layer 522 over the surfaces 557 of the trench 527 and the via opening 528. The surface 511 of the first pad 510 may not have a seed layer.

Figure 5D:
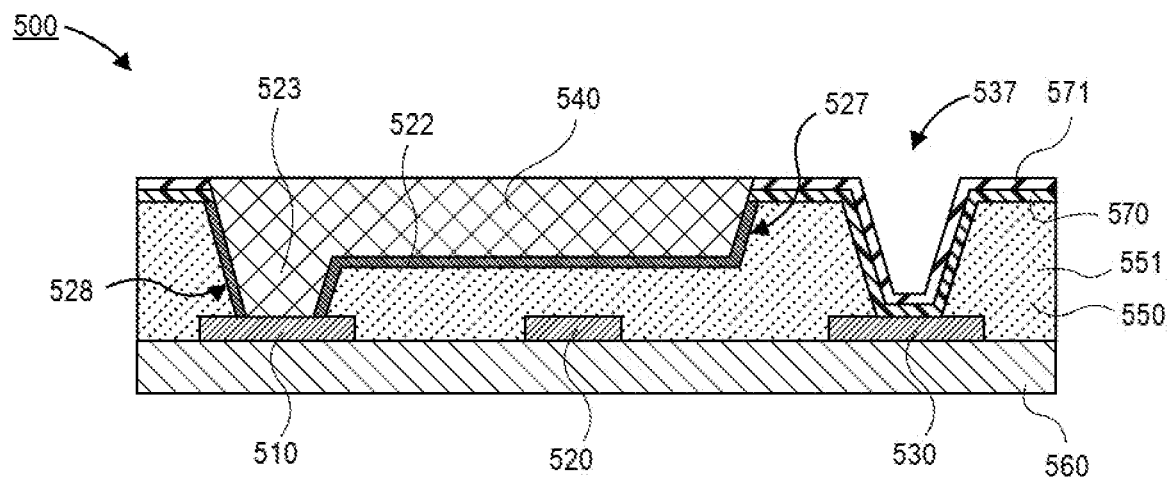
FIG. 5D is a cross-sectional illustration after a via is disposed in the via opening and a conductive plate is disposed in the trench, in accordance with an embodiment.

Referring now to FIG. 5D, a cross-sectional illustration of the electronic package 500 after a via 523 is disposed in the via opening 528 and a conductive plate 540 is disposed in the trench 527. In an embodiment, the via 523 and the conductive plate 540 may be deposited with a plating process, such as an electroless process or an electrolytic process. In an embodiment, after the formation of the conductive plate 540 the process flow may continue with operations substantially similar to those described with respect to FIGS. 3H and 3I to finish fabricating the electronic package 500.

Figure 6:
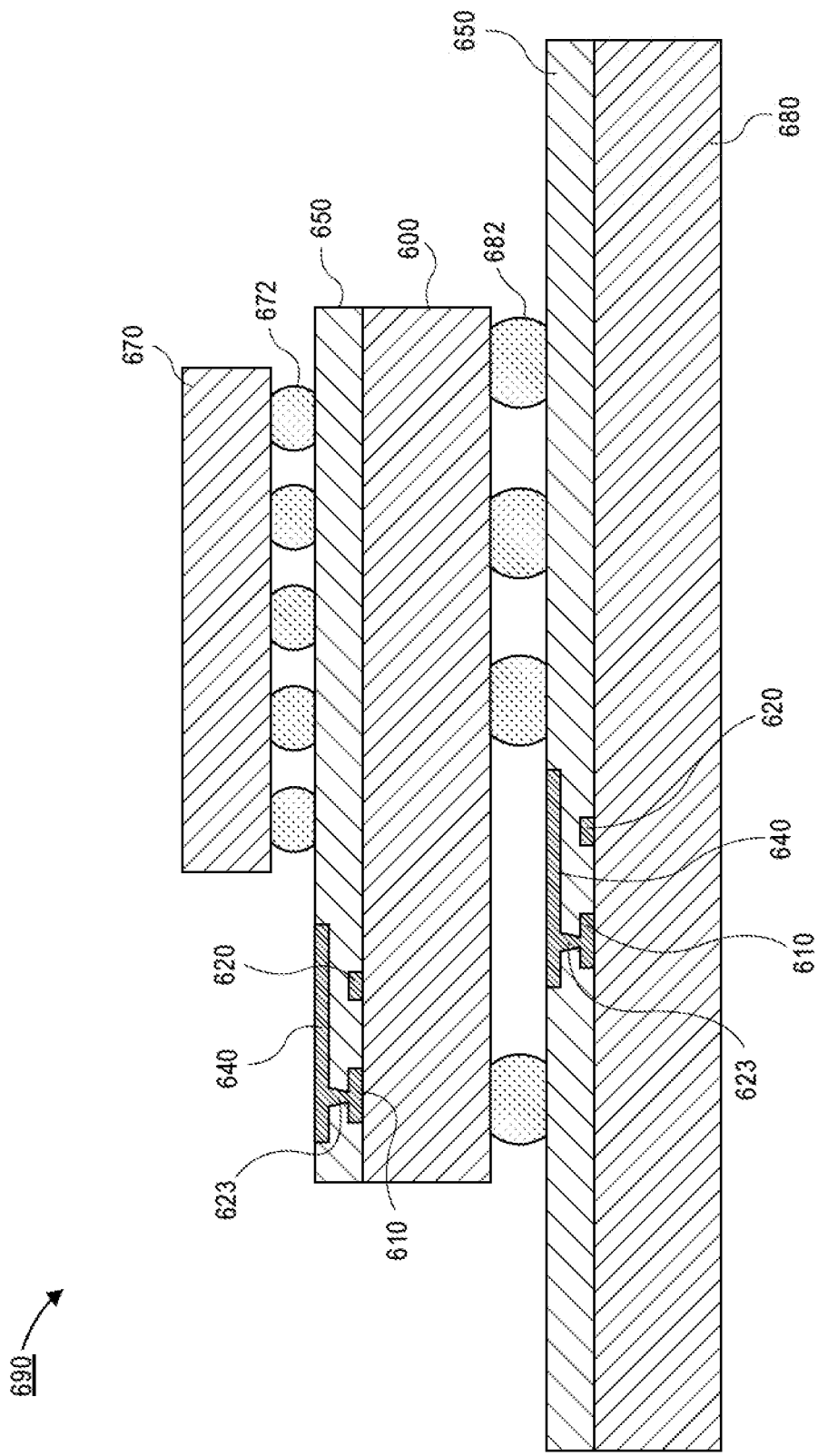
FIG. 6 is a cross-sectional illustration of an electronic system that comprises an electronic package with a conductive plate embedded in a solder resist over a signal trace, in accordance with an embodiment.

Referring now to FIG. 6, a cross-sectional illustration of an electronic system 690 is shown, in accordance with an embodiment. In an embodiment, the electronic system 690 may comprise a board 680 and an electronic package 600 attached to the board with interconnects 682 (e.g., solder bumps or the like). In an embodiment, one or more dies 670 may be attached to the electronic package with interconnects 672 (e.g., solder bumps or the like).

In an embodiment, the electronic package 600 may comprise a solder resist 650 over a surface. In an embodiment, one or more conductive plates 640 may be embedded in the solder resist 650. The conductive plate 640 may be electrically coupled to a ground pad 610 by a via 623. In an embodiment, the conductive plate 640 may extend over a trace 620 (e.g., a signal trace).

In an embodiment, the board 680 may comprise a solder resist 650 over a surface. In an embodiment, one or more conductive plates 640 may be embedded in the solder resist 650. The conductive plate 640 may be electrically coupled to a ground pad 610 by a via 623. In an embodiment, the conductive plate 640 may extend over a trace 620 (e.g., a signal trace).

Figure 7:
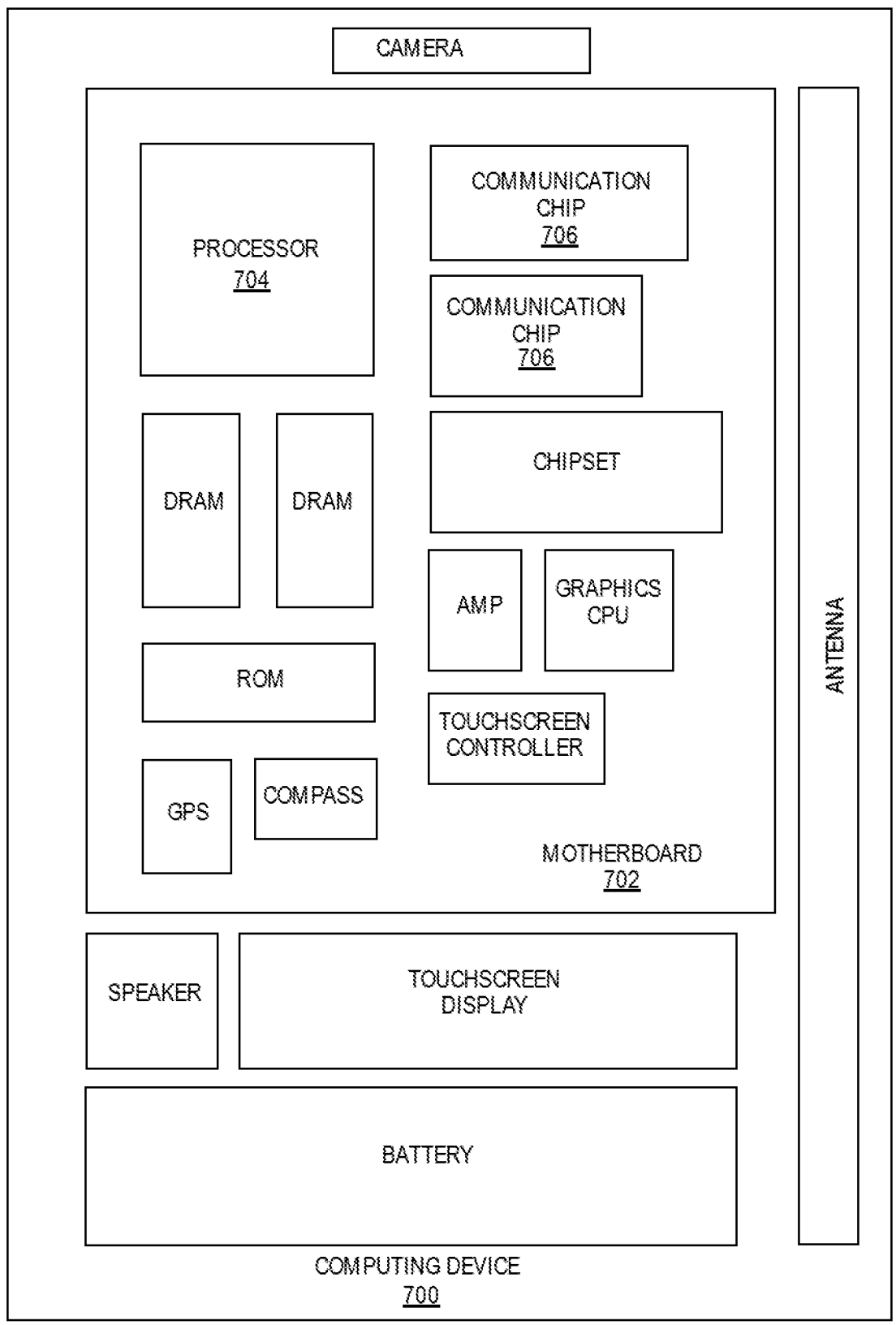
FIG. 7 is a schematic of a computing device built in accordance with an embodiment.

FIG. 7 illustrates a computing device 700 in accordance with one implementation of the invention. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the invention, the integrated circuit die of the processor may be packaged in an electronic system that comprises a solder resist with an embedded conductive plate over a trace, in accordance with embodiments described herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of the invention, the integrated circuit die of the communication chip may be packaged in an electronic system that comprises a solder resist with an embedded conductive plate over a trace, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a substrate layer; a trace over the substrate layer; a first pad over the substrate layer; a solder resist over the trace and the first pad; a trench into the solder resist, the trench extending over the trace; and a conductive plate in the trench, wherein the conductive plate is electrically coupled to the first pad by a via that extends from a bottom surface of the trench through the solder resist.

Example 2: the electronic package of Example 1, wherein the trace has a first end and a second end, and wherein the conductive plate covers the trace from the first end to the second end.

Example 3: the electronic package of Example 1 or Example 2, wherein the first pad is laterally adjacent to the trace.

Example 4: the electronic package of Examples 1-3, further comprising a solder resist opening (SRO) through the solder resist, the solder resist opening exposing a surface of a second pad.

Example 5: the electronic package of Examples 1-4, further comprising: a solder bump in the SRO.

Example 6: the electronic package of Examples 1-5, wherein a surface finish is over the surface of the second pad.

Example 7: the electronic package of Examples 1-6, wherein a surface finish is over a surface of the conductive plate.

Example 8: the electronic package of Examples 1-7, wherein the conductive plate is electrically coupled to a plurality of first pads by a plurality vias.

Example 9: the electronic package of Examples 1-8, wherein a thickness of solder resist between a bottom surface of the conductive plate and a top surface of the trace is between 2 μm and 145 μm.

Example 10: the electronic package of Examples 1-9, further comprising a seed layer between the conductive plate and the solder resist.

Example 11: the electronic package of Examples 1-10, wherein the seed layer is present between the via and the first pad.

Example 12: the electronic package of Examples 1-11, wherein the solder resist comprises palladium, gold, silver, ruthenium, cobalt, copper, nickel, titanium, aluminum, lead, silicon, or tantalum particles.

Example 13: the electronic package of Examples 1-12, wherein the first pad is a ground pad.

Example 14: the electronic package of Examples 1-13, wherein the trace is for propagating signals.

Example 15: a method of fabricating an electronic package, comprising: disposing a solder resist over a substrate layer, wherein a first pad, a second pad, and a trace are positioned over the substrate layer; forming a solder resist opening (SRO) through the solder resist to expose the second pad; forming a mask over the solder resist and the exposed second pad; forming a trench into the solder resist, wherein the trench extends over the trace; forming a via opening to expose the first pad, wherein the via opening is within a footprint of the trench; disposing a seed layer into the trench and the via opening; disposing a via in the via opening and a plate in the trench; and removing the mask.

Example 16: the method of Example 15, wherein the mask comprises $TiO_2$.

Example 17: the method of Example 15 or Example 16, wherein forming the mask, comprises: disposing a titanium layer; and oxidizing the titanium layer to form a $TiO_2$ surface.

Example 18: the method of Examples 15-17, wherein the seed layer comprises palladium, and wherein the palladium does not adsorb to the $TiO_2$.

Example 19: the method of Examples 15-18, wherein disposing the via in the via opening and the plate in the trench comprises an electroless deposition process.

Example 20: the method of Examples 15-19, wherein disposing the via in the via opening and the plate in the trench comprises an electrolytic deposition process.

Example 21: the method of Examples 15-20, wherein the solder resist comprises palladium, gold, silver, ruthenium, cobalt, copper, nickel, titanium, aluminum, lead, silicon, or tantalum particles, and wherein the seed layer is disposed during a laser ablation process used to form the trench and the via opening.

Example 22: the method of Examples 15-21, further comprising: disposing a surface finish over the second pad and the plate.

Example 23: an electronic system, comprising: an electronic package, the electronic package comprising: a substrate; a first pad over the substrate; a trace over the substrate; a solder resist over the first pad and the trace; a trench into the solder resist, the trench extending over the trace; and a conductive plate in the trench, wherein the conductive plate is electrically coupled to the first pad by a via; and a die electrically coupled to the electronic package.

Example 24: electronic package of Example 23, wherein the electronic package is electrically coupled to a board.

Example 25: the electronic package of Example 23 or Example 24, wherein the first pad is laterally adjacent to the trace, wherein the trace has a first end and a second end, and wherein the conductive plate covers the trace from the first end to the second end.

What is claimed is:

1. An electronic package, comprising:
   a substrate layer;
   a trace over the substrate layer;
   a first pad over the substrate layer, the first pad having an uppermost surface at a same level as an uppermost surface of the trace;
   a solder resist over the trace and the first pad;
   a trench into the solder resist, the trench extending over the trace; and
   a conductive plate in the trench, wherein the conductive plate is electrically coupled to the first pad by a via that extends from a bottom surface of the trench through the solder resist, and wherein the conductive plate has an uppermost surface at a same level as an uppermost surface of the solder resist.

2. The electronic package of claim 1, wherein the trace has a first end and a second end, and wherein the conductive plate covers the trace from the first end to the second end.

3. The electronic package of claim 2, wherein the first pad is laterally adjacent to the trace.

4. The electronic package of claim 1, further comprising a solder resist opening (SRO) through the solder resist, the solder resist opening exposing a surface of a second pad.

5. The electronic package of claim 4, further comprising:
   a solder bump in the SRO.

6. The electronic package of claim 4, wherein a surface finish is over the surface of the second pad.

7. The electronic package of claim 6, wherein a surface finish is over a surface of the conductive plate.

8. The electronic package of claim 1, wherein the conductive plate is electrically coupled to a plurality of first pads by a plurality vias.

9. The electronic package of claim 1, wherein a thickness of solder resist between a bottom surface of the conductive plate and a top surface of the trace is between 2 μm and 145 μm.

10. The electronic package of claim 1, further comprising a seed layer between the conductive plate and the solder resist.

11. The electronic package of claim 10, wherein the seed layer is present between the via and the first pad.

12. The electronic package of claim 1, wherein the solder resist comprises palladium, gold, silver, ruthenium, cobalt, copper, nickel, titanium, aluminum, lead, silicon, or tantalum particles.

13. The electronic package of claim 1, wherein the first pad is a ground pad.

14. The electronic package of claim 1, wherein the trace is for propagating signals.

15. An electronic system, comprising:
    an electronic package, the electronic package comprising:
      a substrate;
      a first pad over the substrate;
      a trace over the substrate, the trace having an uppermost surface at a same level as an uppermost surface of the first pad;
      a solder resist over the first pad and the trace;
      a trench into the solder resist, the trench extending over the trace; and
      a conductive plate in the trench, wherein the conductive plate is electrically coupled to the first pad by a via, and wherein the conductive plate has an uppermost surface at a same level as an uppermost surface of the solder resist; and
    a die electrically coupled to the electronic package.

16. The electronic package of claim 15, wherein the electronic package is electrically coupled to a board.

17. The electronic package of claim 15, wherein the first pad is laterally adjacent to the trace, wherein the trace has a first end and a second end, and wherein the conductive plate covers the trace from the first end to the second end.

* * * * *